United States Patent
Vaartstra et al.

(10) Patent No.: US 6,197,628 B1
(45) Date of Patent: Mar. 6, 2001

(54) RUTHENIUM SILICIDE DIFFUSION BARRIER LAYERS AND METHODS OF FORMING SAME

(75) Inventors: Brian A. Vaartstra, Nampa; Eugene P. Marsh, Boise, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/141,240

(22) Filed: Aug. 27, 1998

(51) Int. Cl.$^7$ ................................. H01L 21/8234

(52) U.S. Cl. .................. 438/238; 438/627; 438/643; 438/653; 257/486; 257/740; 257/741; 257/757

(58) Field of Search ..................... 438/627, 643, 438/653, 238; 424/425, 424; 257/486, 740, 751, 767

(56) References Cited

U.S. PATENT DOCUMENTS

| | | |
|---|---|---|
| 4,907,052 | 3/1990 | Takada et al. . |
| 5,168,332 | 12/1992 | Kunishima et al. ................. 257/385 |
| 5,270,241 | 12/1993 | Dennison et al. . |
| 5,362,632 | 11/1994 | Mathews . |
| 5,372,849 | 12/1994 | McCormick et al. ............... 427/253 |
| 5,392,189 | 2/1995 | Fazan et al. . |
| 5,491,365 | 2/1996 | Chin et al. . |
| 5,510,651 | 4/1996 | Maniar et al. . |
| 5,520,992 | 5/1996 | Douglas et al. . |
| 5,555,486 | 9/1996 | Kingon et al. . |
| 5,561,307 | 10/1996 | Mihara et al. . |
| 5,566,045 | 10/1996 | Summerfelt et al. . |
| 5,581,436 | 12/1996 | Summerfelt et al. . |
| 5,612,574 | 3/1997 | Summerfelt et al. . |
| 5,618,746 | 4/1997 | Hwang . |
| 5,637,527 | 6/1997 | Baek . |
| 5,679,980 | 10/1997 | Summerfelt . |

FOREIGN PATENT DOCUMENTS 0 856 879   8/1998   (EP) .

OTHER PUBLICATIONS

H. D. Bhatt et al., Novel High temperature multilayer electrode–barrier structure for high–density ferroelectric memories. Aug. 1997. Applied Physics Letters vol. 71, p. 719–721.

T. Kawahara et al. (Ba,Sr) TiO3 Films prepared by Liquid Source Chemical Vapor Deposition on Ru Electrodes. Sep. 1996. Jpn, J. Applied Phys. vol. 35 p. 4880–4885.

Bhatt et al., "Novel high temperature multilayer electrode–barrier structure for high density ferroelectric memories," *Appl. Phys. Letters*, 71 (1997).

Green et al., "Chemical Vapor Deposition of Ruthenium and Ruthenium Dioxide Films," *J. Electrochem. Soc.*, 132, 2677–2685 (1985).

Kawahara et al., "(Ba, Sr)TiO$_3$ Films Prepared by Liquid Source Chemical Vapor Deposition on Ru Electrodes," *Jpn. J. Appl. Phys.*, 35, 4880–4885 (1996).

Liao et al., "Characterization of RuO$_2$ thin films deposited on Si by metal–organic chemical vapor deposition," *Thin Solid Films*, 287, 74–79 (1996).

Primary Examiner—Matthew Smith
Assistant Examiner—Granvill Lee
(74) Attorney, Agent, or Firm—Mueting, Raasch & Gebhardt, P.A.

(57) ABSTRACT

A method for use in the fabrication of integrated circuits includes providing a substrate assembly having a surface. A diffusion barrier layer is formed over at least a portion of the surface. The diffusion barrier layer is formed of RuSi$_x$, where x is in the range of about 0.01 to about 10. The barrier layer may be formed by depositing RuSi$_x$ by chemical vapor deposition or the barrier layer may be formed by forming a layer of ruthenium relative to a silicon containing region and performing an anneal to form RuSi$_x$ from the layer of ruthenium and the silicon containing region. Capacitor electrodes, interconnects or other structures may be formed with such a diffusion barrier layer.

26 Claims, 5 Drawing Sheets

RUTHENIUM SILICIDE DIFFUSION BARRIER LAYERS AND METHODS OF FORMING SAME

FIELD OF THE INVENTION

The present invention relates to semiconductor devices and the fabrication thereof. More particularly, the present invention pertains to diffusion barrier layers.

BACKGROUND OF THE INVENTION

In the fabrication of integrated circuits, various conductive layers are used. For example, during the formation of semiconductor devices, such as dynamic random access memories (DRAMs), static random access memories (SRAMs), ferroelectric (FE) memories, etc., conductive materials are used in the formation of storage cell capacitors and also may be used in interconnection structures, e.g., conductive layers in contact holes, vias, etc. In many applications, it is preferable that the materials used provide effective diffusion barrier characteristics.

For example, effective diffusion barrier characteristics are required for conductive materials used in the formation of storage cell capacitors of memory devices, e.g., DRAMs. As memory devices become more dense, it is necessary to decrease the size of circuit components forming such devices. One way to retain storage capacity of storage cell capacitors of the memory devices and at the same time decrease the memory device size is to increase the dielectric constant of the dielectric layer of the storage cell capacitor. Therefore, high dielectric constant materials are used in such applications interposed between two electrodes. One or more layers of various conductive materials may be used as the electrode material. However, generally, one or more of the layers of the conductive materials used for the electrodes (particularly the bottom electrode of a cell capacitor) must have certain diffusion barrier properties, e.g., silicon diffusion barrier properties. Such properties are particularly required when high dielectric constant materials are used for the dielectric layer of the storage cell capacitor because of the processes used for forming such high dielectric materials, e.g., deposition of high dielectric materials usually occurs at high temperatures (generally greater than about 500° C.) in an oxygen-containing atmosphere.

Generally, various metals and metallic compounds, for example, metals such as platinum, and conductive metal oxides, such as ruthenium oxide, have been proposed as the electrodes or at least one of the layers of an electrode stack for use with high dielectric constant materials. However, reliable electrical connections should generally be constructed which do not diminish the beneficial properties of the high dielectric constant materials. For platinum or ruthenium oxide to function well as a bottom electrode or as one of the layers of an electrode stack, an effective barrier to the diffusion of silicon from the substrate or other silicon containing region to the top of the electrode needs to be provided. This is required since silicon at the surface of the electrode stack will tend to be oxidized during the oxygen anneal of the high dielectric constant materials, e.g, $Ta_2O_5$ or $BaSrTiO_3$, which will result in a decreased series capacitance, thus degrading the storage capacity of the cell capacitor.

Platinum and ruthenium oxide, used alone as an electrode, are generally too permeable to silicon to be used as a bottom electrode of a storage cell capacitor formed on a silicon substrate region. Because of the permeability of such materials to silicon, typically platinum is used as a layer in an electrode stack which acts as the electrode as well as a diffusion barrier for integration of capacitors directly formed on silicon. For example, as described in the article "Novel High Temperature Multilayer Electrode-Barrier Structure for High Density Ferroelectric Memories" by H. D. Bhatt, et al., *Appl. Phys. Letter*, 71(5), Aug. 4, 1997, the electrode barrier structure includes layers of platinum: rhodium alloy, in addition to platinum: rhodium oxide layers, to form electrodes with diffusion barrier properties. Such alloy layers are formed using physical vapor deposition (PVD) processing, e.g., reactive RF sputtering processes. Further, for example, the article entitled "(Ba, Sr)TiO$_3$ Films Prepared by Liquid Source Chemical Vapor Deposition on Ru Electrodes" by Kawahara et al., *Jpn.J.Appl.Phys.*, Vol. 35 (1996) Pt. 1, No. 9B, pp. 4880–4885, describes the use of ruthenium and ruthenium oxide for forming electrodes in conjunction with high dielectric constant materials.

Many storage cell capacitors are fabricated which include electrode layers that are formed by deposition of a conductive material within a small high aspect ratio opening. Typically, sputtering does not provide a sufficiently conformal layer adequate for formation of an electrode layer within such a small high aspect ratio opening.

In addition to the formation of capacitor electrodes, the formation of barrier layers for use in other applications, e.g., interconnect applications, is also desirable. For example, diffusion barriers are commonly used to prevent undesirable reactions in contact openings.

SUMMARY OF THE INVENTION

To overcome the problems described above, $RuSi_x$ diffusion barrier layers, along with structures incorporating such diffusion barrier layers and methods associated therewith, are described herein.

A method for use in the fabrication of integrated circuits according to the present invention includes providing a substrate assembly having a surface. A diffusion barrier layer is formed over at least a portion of the surface. The diffusion barrier layer is formed of $RuSi_x$, where x is in the range of about 0.01 to about 10.

In one embodiment of the method, the diffusion barrier layer is formed of $RuSi_x$, where x is in the range of about 1 to about 3, more preferably about 2.

In another embodiment of the method, the barrier layer is formed by depositing $RuSi_x$ by chemical vapor deposition. In an alternative embodiment, the barrier layer is formed by forming a layer of ruthenium relative to a silicon containing region and performing an anneal to form $RuSi_x$ from the layer of ruthenium and the silicon containing region.

A method for use in the formation of a capacitor according to the present invention includes forming a first electrode on a portion of a substrate assembly. A high dielectric material is formed over at least a portion of the first electrode and a second electrode is formed over the high dielectric material. At least one of the first and second electrodes includes a barrier layer formed of $RuSi_x$, where x is in the range of about 0.01 to about 10.

Another method according to the present invention for use in the formation of a capacitor includes providing a silicon containing region of a substrate assembly. A first electrode is formed on at least a portion of the silicon containing region of the substrate assembly. The first electrode includes a barrier layer of $RuSi_x$, where x is in the range of about 0.01 to about 10. A high dielectric material is formed over at least a portion of the first electrode and a second electrode is provided over the high dielectric material.

In one embodiment of the method, the formation of the barrier layer includes forming a layer of ruthenium on at least a portion of the silicon containing region. Thereafter, the layer of ruthenium formed on the at least a portion of the silicon containing region is annealed resulting in the $RuSi_x$ barrier layer. The layer of ruthenium may be deposited by chemical vapor deposition with a thickness of about 10 Å to about 300 Å.

In another embodiment of the method, one or more conductive layers are formed relative to the $RuSi_x$ barrier layer. The one or more conductive layers are formed of at least one of a metal or a conductive metal oxide, e.g., formed from materials selected from the group of $RuO_2$, $RhO_2$, $MoO_2$, $IrO_2$, Ru, Rh, Pd, Pt, and Ir.

A semiconductor device structure according to the present invention includes a substrate assembly including a surface and a diffusion barrier layer over at least a portion of the surface. The diffusion barrier layer is formed of $RuSi_x$, where x is in the range of about 0.01 to about 10.

In one embodiment of the structure, at least a portion of the surface is a silicon containing surface and the structure includes one or more additional conductive layers over the diffusion barrier layer formed of at least one of a metal and a conductive metal oxide, e.g., formed from materials selected from the group of $RuO_2$, $RhO_2$, $MoO_2$, $IrO_2$, Ru, Rh, Pd, Pt, and Ir.

A capacitor structure according to the present invention is also described. The capacitor structure includes a first electrode, a high dielectric material on at least a portion of the first electrode, and a second electrode on the dielectric material. At least one of the first and second electrode includes a diffusion barrier layer formed of $RuSi_x$, where x is in the range of about 0.01 to about 10.

An integrated circuit structure according to the present invention includes a substrate assembly including at least one active device and a silicon containing region. An interconnect is formed relative to the at least one active device and the silicon containing region. The interconnect includes a diffusion barrier layer on at least a portion of the silicon containing region. The diffusion barrier layer is formed of $RuSi_x$, where x is in the range of about 0.01 to about 10.

BRIEF DESCRIPTION OF THE DRAWINGS

The present invention will be better understood from reading the following description of illustrative embodiments with reference to the attached drawings, wherein below.

DETAILED DESCRIPTION OF THE EMBODIMENTS

Figure 1:
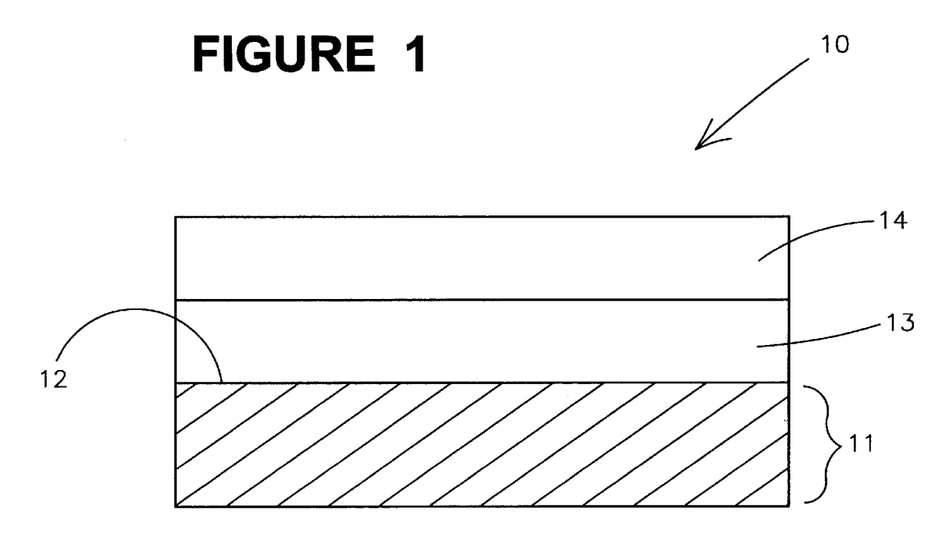
FIG. 1 shows a device structure including a $RuSi_x$ diffusion barrier layer according to the present invention.
Figure 2A:
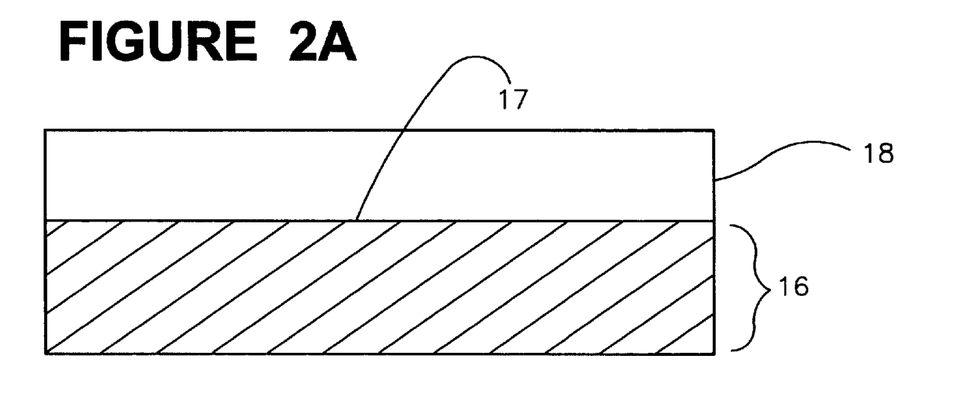
FIGS. 2A–2C show one method of forming the $RuSi_x$ diffusion barrier layer according to the present invention.
Figure 2B:
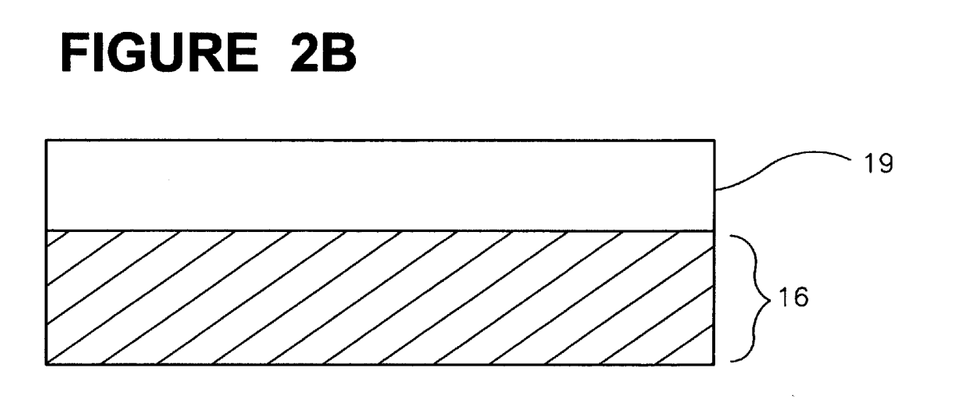
Figure 2C:
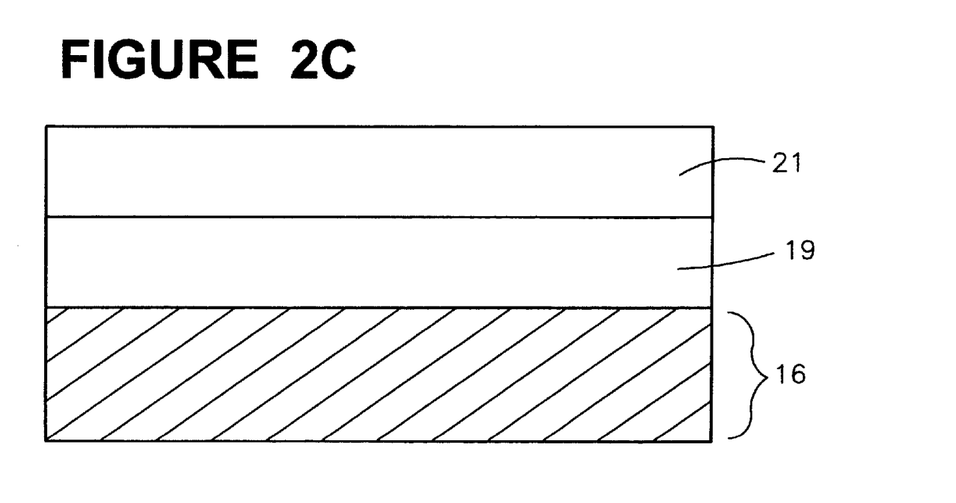

The present invention shall be described generally with reference to FIGS. 1–2. Thereafter, embodiments and illustrations of applications of the present invention shall be described with reference to FIGS. 3–6 and an example shall be described with reference to FIG. 7.

FIG. 1 illustrates a structure 10 including a substrate assembly 11 and a $RuSi_x$ diffusion barrier layer 13 according to the present invention formed on a surface 12 of the substrate assembly 11, e.g., a silicon containing surface. The structure 10 further includes another conductive layer 14. The structure 10 is illustrative of the use of a $RuSi_x$ diffusion barrier layer for any application requiring an effective barrier layer, for example, to prevent diffusion from a silicon containing surface. In other words, the $RuSi_x$ diffusion barrier layer 13 may be used in the fabrication of semiconductor devices wherever it is necessary to prevent the diffusion of one material to an adjacent material. For example, the substrate assembly 11 may be representative of a contact structure having an opening extending to a silicon containing surface. In such a structure, diffusion barriers are commonly used in such openings to prevent undesirable reactions, such as the reaction of a conductive contact material, e.g, aluminum, with the silicon containing surface.

Further, for example, the $RuSi_x$ diffusion barrier layer 13 may be used in the formation of storage cell capacitors for use in semiconductor devices, e.g., memory devices. As further described herein, the $RuSi_x$ diffusion barrier layer is used within a stack of layers forming an electrode of a capacitor, e.g., the other layers including layers formed of materials such as platinum, ruthenium oxide, etc. One skilled in the art will recognize that various semiconductor processes and structures for various devices, e.g., CMOS devices, memory devices, etc., would benefit from the barrier characteristics of the barrier layers of the present invention and in no manner is the present invention limited to the illustrative embodiments described herein.

As used in this application, "substrate assembly" refers to either a semiconductor substrate such as the base semiconductor layer, e.g., the lowest layer of a silicon material in a wafer, or a silicon layer deposited on another material, such as silicon on sapphire, or a semiconductor substrate having one or more layers or structures formed thereon or regions formed therein. When reference is made to a substrate assembly in the following description, various process steps may have been previously used to form or define regions, junctions, various structures or features, and openings such as vias, contact openings, high aspect ratio openings, etc.

The amount of silicon incorporated into the $RuSi_x$ diffusion barrier layer 13 is sufficient to accomplish barrier characteristics for semiconductor devices, particularly for diffusion of silicon. Preferably, the $RuSi_x$ diffusion barrier layer 13 according to the present invention includes an atomic composition such that x is in the range of about 0.01 to about 10. More preferably, x is in the range of about 1 to about 3, and yet more preferably, x is about 2.

The thickness of the $RuSi_x$ diffusion barrier layer 13 is dependent upon the application for which it is used. Preferably, the thickness is in the range of about 10 Å to about 300 Å. More preferably, the thickness of the $RuSi_x$ diffusion barrier layer 13 is in the range of about 50 Å to about 200 Å. For example, this preferred thickness range of about 50 Å to about 200 Å is applicable to a $RuSi_x$ diffusion barrier layer used for forming a bottom electrode stack of a capacitor structure.

In the general illustration of FIG. 1, the conductive layer 14 is representative of a single layer or one or more layers. For example, the conductive layer may include one or more layers formed of a metal or metal oxide, or combinations thereof. For example, such layers may include one of $RuO_2$, $MoO_2$, Rh, $RhO_2$, $IrO_2$, Ru, Pt, Pd and Ir, such as in the use of the $RuSi_x$ diffusion barrier layer in an electrode stack. Further, for example, the conductive layer 14 may be a contact material such as aluminum when the $RuSi_x$ diffusion barrier layer is used in a contact or interconnect application. Such conductive layers may be formed by any method known to those skilled in the art. The present invention is in no manner limited to any particular conductive layer or method for forming such conductive layers.

The $RuSi_x$ diffusion barrier layer 13 may be formed by one or more various processes. For example, the formation of the $RuSi_x$ diffusion barrier layer may be sputter deposited from a deposition target of $RuSi_x$, may be deposited by the sputtering from a deposition target of ruthenium onto a silicon containing surface followed by an anneal, and may be deposited by chemical vapor deposition (CVD) using a ruthenium precursor and a silicon precursor, for example, such as atmospheric pressure chemical vapor deposition, low pressure chemical vapor deposition (LPCVD), plasma enhanced chemical vapor deposition (PECVD), or any other chemical vapor deposition technique. Further, the $RuSi_x$ diffusion barrier layer may be formed by depositing a layer of ruthenium using CVD onto a silicon containing surface followed by an annealing process. Preferably, the formation of the $RuSi_x$ diffusion barrier layer is attained with the use of CVD.

Such a CVD process may be carried out in a chemical vapor deposition reactor, such as a reaction chamber available under the trade designation of 7000 from Genus, Inc., (Sunnyvale, Calif.), a reaction chamber available under the trade designation of 5000 from Applied Materials, Inc., (Santa Clara, Calif.), or a reaction chamber available under the trade designation of Prism from Novelus, Inc., (San Jose, Calif.). However, any reaction chamber suitable for performing CVD may be used.

Chemical vapor deposition (CVD) is defined as the formation of a nonvolatile solid film on a substrate by the reaction of vapor phase reactants, i.e., reactant gases, that contain desired components. The reactant gases are introduced into the reaction chamber. The gases decompose and react at a heated wafer surface to form the desired layer. Chemical vapor deposition is just one process of providing thin layers on semiconductor wafers, such as films of elemental metals or compounds, e.g., platinum, ruthenium oxide, iridium, molybdenum oxide, etc. Chemical vapor deposition processes are favored in many respects because of the process capability to provide highly conformal layers even within deep contacts and other openings. Thus, as described further below with reference to FIGS. 5 and 6, CVD processing is preferably used to provide highly conformal layers within deep contacts and other openings such as for lower electrodes of storage cell capacitors. It will be readily apparent to one skilled in the art that although CVD is the preferred process, that the CVD process may be enhanced by various related techniques such as plasma assistance, photo assistance, laser assistance, as well as other techniques.

One preferred method of forming the $RuSi_x$ diffusion barrier layer 13 is by depositing $RuSi_x$ by chemical vapor deposition (CVD). The CVD process is conducted with a ruthenium precursor being delivered to a reaction chamber along with a silicon precursor.

The ruthenium precursor is generally a liquid precursor. The ruthenium precursor is contained in a bubbler reservoir through which a carrier gas, such as helium or any other inert gas, i.e., a gas that is nonreactive with other gases of the process (e.g., nitrogen, argon, neon, and xenon), is bubbled through the reservoir containing the precursor to deliver the precursor to the reaction chamber. For example, a carrier gas having a flow in the range of about one sccm to about 500 sccm may be used in a bubbler having a pressure in the range of about 0.5 torr to about 50 torr and a temperature in the range of about 30° C. to about 70° C. to deliver a ruthenium precursor to the reaction chamber.

Any ruthenium containing precursor may be used in accordance with the present invention. Preferably, the ruthenium precursors are liquid ruthenium complexes of the following formula (Formula I): $(diene)Ru(CO)_3$ wherein: "diene" refers to linear, branched, or cyclic dienes, bicyclic dienes, tricyclic dienes, fluorinated derivatives thereof, combinations thereof, and derivatives thereof additionally containing heteroatoms such as halide, Si, S, Se, P, As, or N. These precursor complexes and others are described in Assignees' copending patent application entitled "Precursor Chemistries for Chemical Vapor Deposition of Ruthenium and Ruthenium Oxide" having U.S. Ser. No. 09/421,236 filed Aug. 27, 1998 and in Assignees' copending patent application entitled "Methods for Preparing Ruthenium and Osmium Compounds" having U.S. Ser. No. 09/141,431 filed Aug. 27, 1998. Further, for example, additional precursors and methods of depositing ruthenium layers are generally discussed in U.S. Pat. No. 5,372,849 to McCormick et al. More preferably, the ruthenium precursors used according to the present invention include one of $C_6H_8Ru(CO)_3$, bis (cyclopentadienyl) ruthenium (II), triruthenium dodecacarbonyl, and cyclopentadienyl dicarbonyl ruthenium (II) dimer.

The silicon precursor is also provided to the reaction chamber. For example, the silicon precursor may include a silicon hydride or silane such as dichlorosilane (DCS, $SiH_2Cl_2$), silane ($SiH_4$), disilane ($H_3SiSiH_3$), trichlorosilane (TCS, $SiHCl_3$), or any other silicon precursor as would be recognnized by one skilled in the art. For example, the silicon precursor may be provided to the reaction chamber at a rate in the range of about 5 sccm to about 500 sccm. Preferably, the rate is about 100 sccm.

One skilled in the art will recognize that the manner in which the gases are introduced into the reaction chamber may include one of various techniques. For example, in addition to provision by bubbler techniques, the introduction may be accomplished with the use of compounds which are gases at room temperature or by heating a volatile compound and delivering the volatile compound to the reaction chamber using a carrier gas. Further, solid precursors and various methods of vaporizing such solid precursors may also be used for introduction of reactant compounds into the chamber. As such, the present invention is not limited to any particular technique. Further, typically, the reactant gases are admitted at separate inlet ports. In addition to the other gases provided to the reaction chamber, an optional dilution gas (i.e., a gas that is non-reactive with the reactant gases) may also be introduced into the chamber such as to change the concentrations of the gases therein. For example, argon gas may be introduced into the chamber at a varied flow rate.

Therefore, in accordance with one method of forming the $RuSi_x$ diffusion barrier layer, the ruthenium precursor gas, the silicon precursor gas, and optionally a dilution gas is provided to the reaction chamber. In this preferred CVD process, the reaction chamber pressure is preferably maintained at a deposition pressure of about 0.1 torr to about 10 torr. The deposition temperature at the wafer surface upon which the $RuSi_x$ diffusion barrier layer 13 is deposited is preferably held at a temperature in a range of about 100° C. to about 700° C., more preferably in the range of about 200° C. to about 500° C.

Another preferred method of forming a RuSi$_x$ diffusion barrier layer 19 according to the present invention is shown in FIGS. 2A–2C. This method forms the RuSi$_x$ diffusion barrier layer 19 by depositing a layer of ruthenium 18 as shown in FIG. 2A onto a silicon containing region of substrate assembly 16 using CVD. The deposition of the ruthenium layer 18 is then followed by an annealing process to react the silicon containing region having silicon containing surface 17 with the ruthenium layer 18 to form the RuSi$_x$ diffusion barrier layer 19 as shown in FIG. 2B. Thereafter, a conductive layer 21 (e.g., one or more conductive layers like conductive layer 14 of FIG. 1) is formed on the RuSi$_x$ diffusion barrier layer 19.

The CVD process for depositing the ruthenium layer 18 is preferably conducted with a ruthenium precursor being delivered to a reaction chamber in generally the same manner as described above with regard to the deposition of RuSi$_x$1. As described therein, the ruthenium precursor is generally a liquid precursor. The ruthenium precursor is contained in a bubbler reservoir through which a carrier gas, such as helium or any other inert gas, i.e., a gas that is nonreactive with other gases of the process (e.g., nitrogen, argon, neon, and xenon), is bubbled through the reservoir containing the precursor to deliver the precursor to the reaction chamber. As described above, any ruthenium-containing precursor may be used in accordance with the present invention.

Therefore, in accordance with this method of forming the RuSi$_x$ diffusion barrier layer, the ruthenium precursor gas and optionally a dilution gas is provided to the reaction chamber. In this particular preferred CVD process, the reaction chamber pressure is preferably maintained at a deposition pressure of about 0.1 torr to about 10 torr. The deposition temperature at the wafer surface upon which the ruthenium layer 18 is deposited is preferably held at a temperature in a range of about 100° C. to about 700° C., more preferably in the range of about 200° C. to about 500° C.

After the ruthenium layer 18 is conformally deposited using CVD, an annealing process is performed to form the RuSi$_x$ diffusion barrier layer 19 from the ruthenium layer 18 and the silicon containing region of substrate assembly 16. The annealing process is preferably performed in situ in the reaction chamber in a nitrogen atmosphere, although any other nonreactive atmosphere may be used, e.g., argon. Preferably, the annealing temperature is within the range of about 400° C. to about 1000° C., more preferably about 500° C. The anneal is preferably performed for a time period of about 0.5 minutes to about 60 minutes. One skilled in the art will recognize that such temperatures and time periods may vary and that the anneal parameters should be sufficient to convert the ruthenium layer 18 into RuSi$_x$ 19, where x is in the ranges as previously described herein. For example, furnace anneals and rapid thermal annealing may be used, and further, such anneals may be performed in one or more annealing steps. Likewise, it may not be necessary to convert the entire ruthenium layer to RuSi$_x$ as long as sufficient barrier properties are attained with the amount of ruthenium converted.

The ruthenium layer 18 deposited for forming the RuSi$_x$ diffusion barrier layer 19 is preferably of a thickness in the range of about 10 Å to about 300 Å. More preferably, the thickness is in the range is about 50 Å to about of 200 Å; and even more preferably the thickness is about 100 Å.

Figure 3:
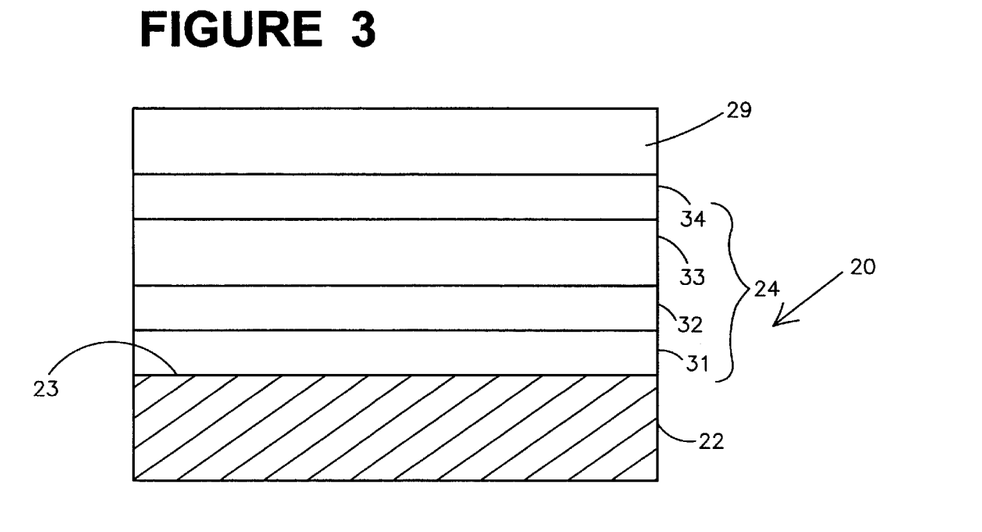
FIG. 3 shows a structure including a $RuSi_x$ diffusion barrier layer according to the present invention as part of a multiple conductive layer stack.

FIG. 3 shows a structure 20 including substrate assembly 22, e.g., a silicon substrate region, and a stack 24. The stack 24 includes conductive layers 31–34. One or more of the conductive layers 31–34 are RuSi$_x$ diffusion barrier layers according to the present invention.

The one or more conductive layers, in addition to including one or more RuSi$_x$ diffusion barrier layers, may include conductive layers formed of various conductive materials. For example, the conductive layers may include, but are clearly not limited to, preferably layers formed of metals, metal oxides or combinations thereof. For example, such layers may include metals such as rhodium, palladium, ruthenium, platinum, and iridium or metal oxides such as ruthenium oxide, molybdenum oxide and iridium oxide.

The stack 24 may be used for one or more numerous applications, e.g., interconnection applications, capacitor applications, etc. For example, stack 24 may be used as an electrode for a storage cell capacitor with substrate assembly 22 including a silicon containing surface 23. As such, the barrier properties of the stack 24 prevent silicon diffusion from silicon-containing surface 23. In accordance with the present invention, the layer 31 may be formed as the RuSi$_x$ diffusion barrier layer to prevent diffusion of silicon from silicon-containing surface 23 through stack 24 to adjacent layer or layers 29 or to the surface of the stack 24, as well as preventing oxygen diffusion to the silicon-containing surface.

Figure 4:
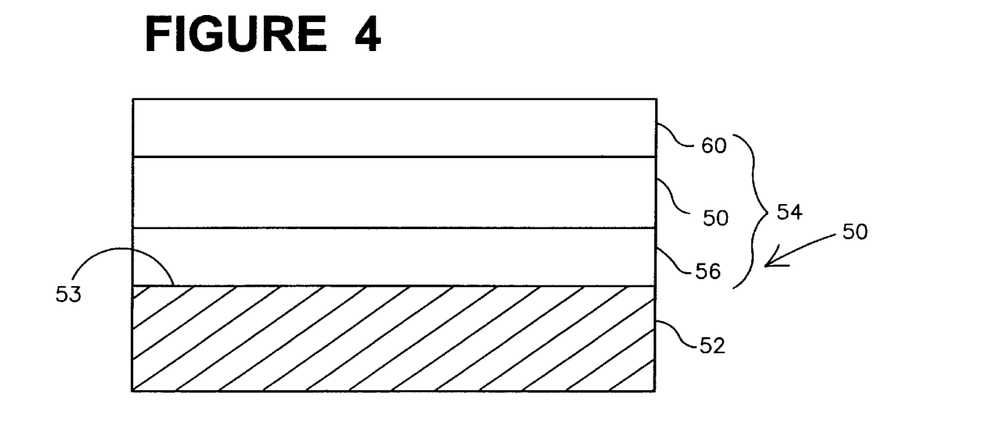
FIG. 4 is a structure showing a high dielectric capacitor including an electrode having a $RuSi_x$ diffusion barrier layer according to the present invention.

FIG. 4 shows a structure 50 including substrate assembly 52, e.g., a silicon substrate, and capacitor structure 54 formed relative thereto. Capacitor structure 54 includes a first electrode 56, a second electrode 60, and a high dielectric constant layer 58 interposed therebetween. For example, the dielectric layer may be any suitable material having a desirable dielectric constant, such as Ta$_2$O$_5$, Ba$_x$Sr$_{(1-x)}$TiO$_3$ [BST], BaTiO$_3$, SrTiO$_3$, PbTiO$_3$, Pb(Zr,Ti)O$_3$[PZT], (Pb, La)(Zr,Ti)O$_3$[PLZT], (Pb,La)TiO$_3$[PLT], KNO$_3$, and LiNbO$_3$. With use of the high dielectric constant layer 58, diffusion barrier properties of the electrodes is particularly important. For example, to function well in a bottom electrode of a capacitor structure, the electrode layer or electrode stack must act as an effective barrier to the diffusion of silicon, particularly due to the processes used to form the high dielectric constant materials. Such diffusion barrier properties are required when the substrate assembly 52 includes a silicon-containing surface 53 upon which the capacitor is formed, e.g., polysilicon, silicon substrate material, N-doped silicon, P-doped silicon, etc., since oxidation of the diffused silicon may result in degraded capacitance, e.g., capacitance for a memory device. In addition, the electrode stack must act as an oxygen barrier to protect the silicon-containing surface under the stack from oxidizing. The formation of the RuSi$_x$ diffusion barrier layer enhances the barrier properties of the stack. One skilled in the art will recognize that stack electrode 56 includes one or more RuSi$_x$ diffusion barrier layers and one or more additional conductive layers such as described with reference to FIG. 3.

Two illustrations of using the RuSi$_x$ diffusion barrier layer as described above are shown and described below with reference to FIGS. 5 and 6. The use of the RuSi$_x$ diffusion barrier layer according to the present invention is described with reference to FIG. 5 wherein a bottom electrode of a high dielectric capacitor of a storage cell includes one or more RuSi$_x$ diffusion barrier layers as described herein. Further, the use of RuSi$_x$ diffusion barrier layers according to the present invention is described with reference to FIG. 6 wherein a contact liner requiring diffusion barrier characteristics is described. For simplistic purposes, the illustrative descriptions are limited to the use of the $RuSi_x$ diffusion barrier layers described in these two illustrative structures. There are other semiconductor processes and structures for various devices, e.g., CMOS devices, memory devices, logic devices, etc., that would benefit from the present invention and in no manner is the present invention limited to the illustrative embodiments described herein, e.g., contact liner and electrode structure. The $RuSi_x$ diffusion barrier layer may be used for any application requiring diffusion barrier characteristics, particularly those for preventing diffusion of silicon and/or oxygen into adjacent layers.

Figure 5:
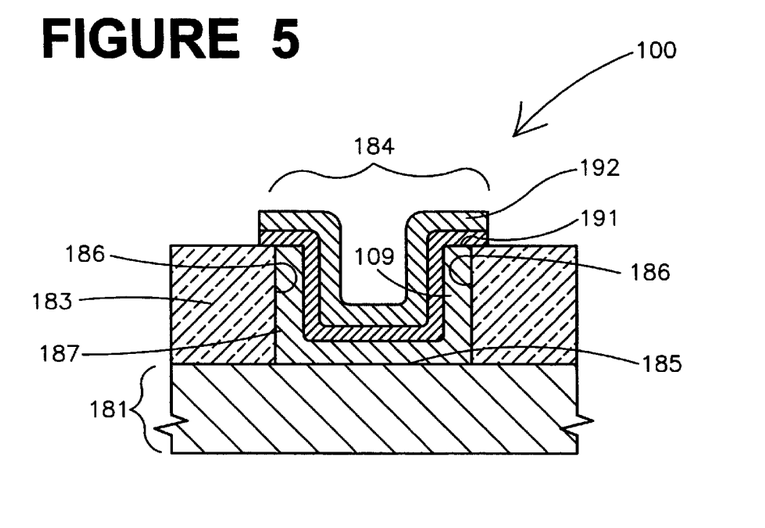
FIG. 5 illustrates the use of a $RuSi_x$ diffusion barrier layer in a storage cell capacitor application.

As shown in FIG. 5, a device structure 100 is fabricated in accordance with conventional processing techniques through the formation of an opening 184 prior to depositing a bottom electrode structure 187 on the surface 185, e.g., a silicon 20 containing surface, and surface 186 defining the opening 184. A bottom electrode stack 187 including a $RuSi_x$ diffusion barrier layer and one or more other conductive layers is formed in opening 184 according to the present invention as previously described herein. The substrate assembly 181 may include various elements, such as field oxide regions, active regions, i.e., those regions of a silicon substrate not covered by field oxide, word lines, field effect transistors (FET), source/drain regions created in the silicon substrate, etc. An insulative layer of oxide material 183 is formed over the substrate assembly. The opening 184 in the insulative layer 183 is a small high aspect ratio opening. As described herein, small high aspect ratio openings have feature sizes or critical dimensions below about 1 micron (e.g., such as a diameter or width of an opening being less than about 1 micron) and aspect ratios greater than about 1. Such aspect ratios are applicable to contact holes, vias, trenches, and any other configured openings. For example, a trench having an opening of 1 micron and depth of 3 microns has an aspect ratio of 3. The present invention is particularly beneficial for forming diffusion barrier layers in small high aspect ratio features due to the use of CVD processes for forming conformal $RuSi_x$ diffusion barrier layers over step structures.

As shown in FIG. 5, a stack electrode 187 including a $RuSi_x$ diffusion barrier layer is formed on the bottom surface 185 and the one or more side walls 186 defining opening 184. The electrode stack layers are formed over the entire structure including the bottom surface 185 and sidewalls 186. Then, the layers are formed into lower electrode 187. For example, the stack layers may be etched or planarized to remove the desired regions for forming the bottom electrode 187. Thereafter, dielectric layer 191 is then formed relative to the stack electrode 187.

Further thereafter, the second electrode 192 is formed relative to the dielectric material 191. For example, such an electrode may be of any conductive material such as tungsten nitride, titanium nitride, tantalum nitride, ruthenium, rhodium, iridium, ruthenium oxide, iridium oxide, any combination thereof, or any other conductive material typically used as an electrode or electrode layer of a storage cell capacitor. With use of the present invention, the bottom electrode formed of a stack of layers including a $RuSi_x$ diffusion barrier layer is conformally formed of uniform thickness using CVD processes as described herein within opening 184. The $RuSi_x$ diffusion barrier layer provides suitable barrier properties.

It will be recognized by one skilled in the art that any capacitor formed relative to a surface, e.g., silicon containing surface, whereupon diffusion barrier properties are required and/or conformally formed conductive layers are required will benefit from the present invention. For example, container capacitors typically include electrodes formed on surfaces requiring conformal formation of a bottom electrode. Such a container capacitor storage cell is described in U.S. Pat. No. 5,270,241 to Dennison, et al., entitled "Optimized Container Stack Capacitor DRAM Cell Utilizing Sacrificial Oxide Deposition and Chemical Mechanical Polishing," issued Dec. 14, 1993.

Figure 6:
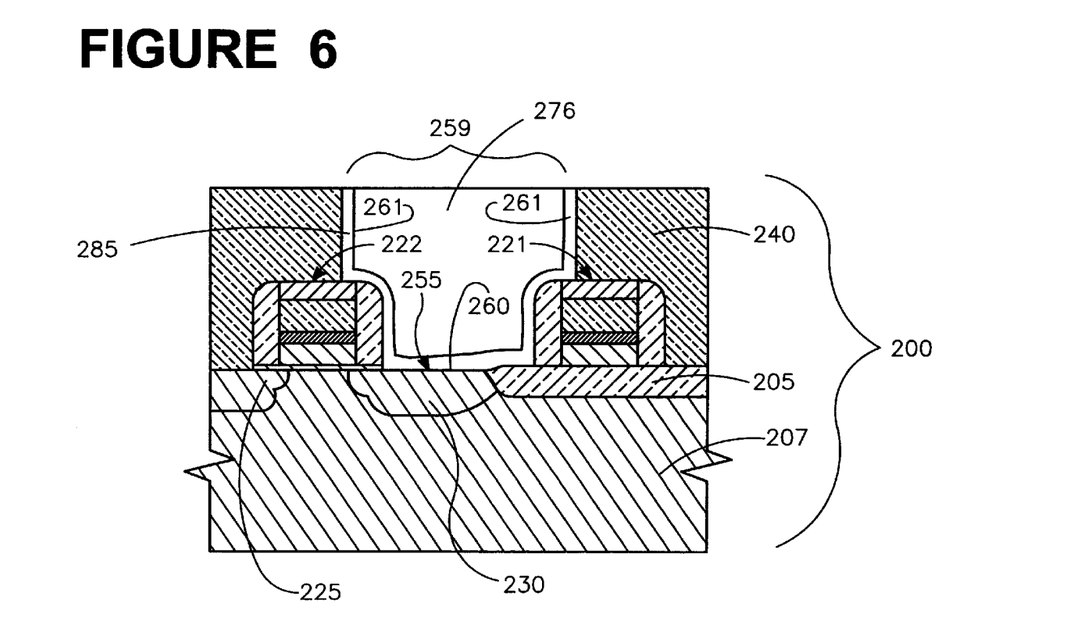
FIG. 6 illustrates the use of a $RuSi_x$ diffusion barrier layer in a contact application.

As shown in FIG. 6, device structure 200 is fabricated in accordance with conventional processing techniques through the formation of contact opening 259 prior to metalization of the contact area 255 of substrate 207. As such, prior to metalization, the device structure 200 includes field oxide regions 205 and active areas, i.e., those regions of substrate 207 not covered by field oxide. Formed relative to the field oxide regions 205 in the active areas are word line 221 and FET 222. Suitably doped source/drain regions 225, 230 are formed as known to one skilled in the art. A conformal layer of oxide material 240 is formed thereover and contact opening 259 is defined therein to the contact area 255 of doped region 230 of silicon substrate 207. Thereafter, one or more metalization or conductive layers are formed in the contact opening 259 for providing electrical connection to substrate region 230. For example, various materials may be formed in contact opening 259, such as titanium nitride or other diffusion barrier materials. Preferably, contact liner 285 is a $RuSi_x$ diffusion barrier layer formed according to the present invention on bottom surface 260 and the one or more side walls 261 defining the opening 259. The $RuSi_x$ diffusion barrier layer is generally deposited over the entire substrate assembly and then planarized to form the contact liner 285. Thereafter, a conductive material 276, e.g., aluminum, is formed in the contact opening for providing connection to doped region 230 of substrate 207.

EXAMPLE 1

Figure 7A:
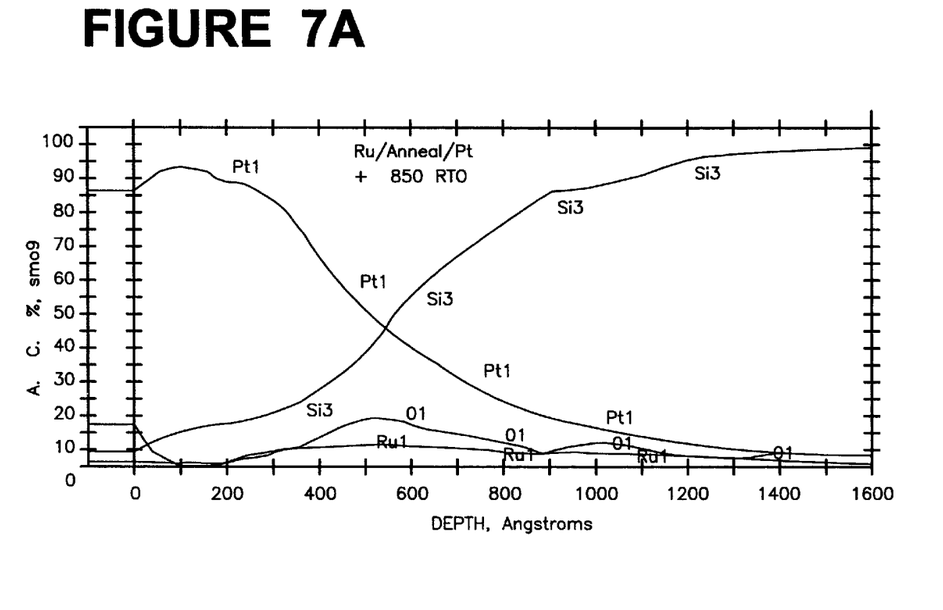
FIGS. 7A–7B show the results of a second example using a $Pt/RuSi_x$ stack formed on silicon.

FIG. 7A shows a depth profile of a sample wafer including a platinum layer having a thickness of about 500 Å formed on a $RuSi_x$ diffusion barrier layer. The $RuSi_x$ diffusion barrier layer is formed by annealing a layer of ruthenium having a thickness of about 100 Å deposited on a silicon substrate. The anneal is performed at about 500° C. for a time period of about 5 minutes. The depth profile is for the sample wafer after the structure has undergone rapid thermal oxidation at a temperature of about 850° C. for a time period of about 30 seconds. There appears to be little if any silicon diffusion through the $RuSi_x$ diffusion barrier layer and therefore, no silicon dioxide formation or platinum silicidation.

The reaction chamber used for fabricating the sample wafer was a CVD chamber manufactured by MDC Vaccuum Products Corp. (Hayward, Calif.) and the bubblers used are glass research bubblers from Technical Glass Service (Boise, Id.). The conditions used for forming the ruthenium layer for use in attaining the $RuSi_x$ diffusion barrier layer include:

Ruthenium Precursor: $C_6H_8Ru(CO)_3$.

Ruthenium Carrier Gas for use through Bubbler: 5 sccm of helium.

Ruthenium Bubbler Conditions: pressure of 3 torr, temperature of 250° C.

Reaction Chamber Conditions: pressure of 0.5 torr, deposition temperature of 300° C. at wafer surface.

Deposition Time: 1 minutes.

The conditions used for the forming the platinum layer include:

Platinum Precursor: (methylcyclopentadienyl)PtMe$_3$

Platinum Carrier Gas for use through Bubbler: 10 sccm of helium.

Platinum Bubbler Conditions: pressure of 10 torr, temperature of 25° C.

Reaction Chamber Conditions: pressure of 5 torr, deposition temperature of 350° C. at wafer surface.

Deposition Time: 6 minutes.

The depth profile was attained by using an XPS device available under the trade designation PhI (Φ) 5600 from Physical Electronics (Eden Prairie, Minn.). The operating conditions for obtaining the profile include x-ray source of 350 W, monochromatic Al k$_\alpha$(hV=1486.6 eV); 45 degree extraction; 800 μm extraction aperture. Sputtering was performed with a 3 keV Argon ion beam rastored over a 3 mm area. The sputter time for the depth profile of FIG. 7A was 20 minutes.

Figure 7B:
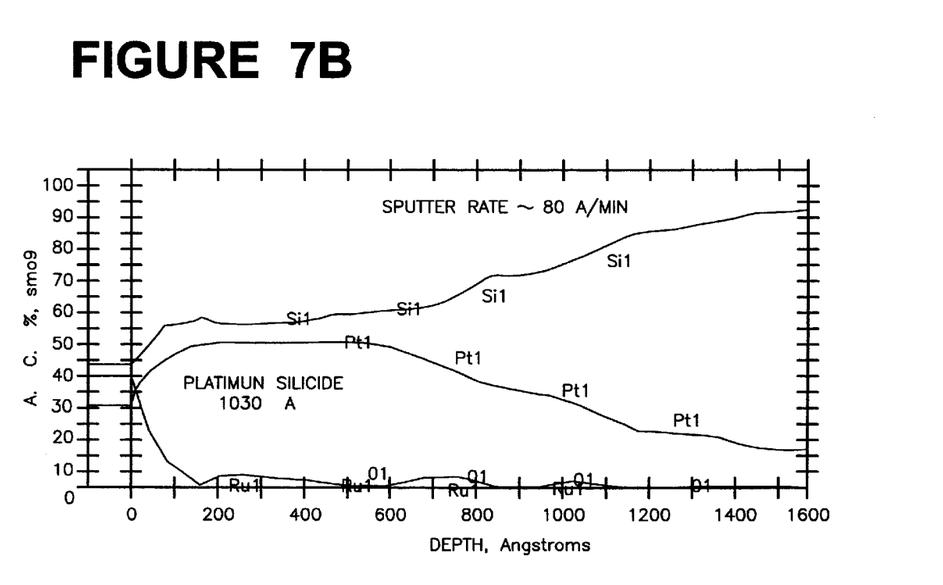

FIG. 7B shows a depth profile of a sample wafer including a platinum layer having a thickness of 450 Å formed over a ruthenium layer having a thickness of about 100 Å formed directly on a silicon substrate without an annealing step to form the RuSi$_x$ diffusion barrier layer as was performed above with respect to FIG. 7A. The depth profile is for the sample wafer after the structure has undergone rapid thermal oxidation at a temperature of about 850° C. for a time period of 30 seconds. The ruthenium and platinum layers are formed in the same manner and conditions as described above with reference to FIG. 7A. Further, the depth profiles were attained in the same manner as described above.

In comparing FIGS. 7A and 7B, it is shown in FIG. 7B that without the RuSi$_x$ diffusion barrier layer the platinum is fully silicided and forms silicon dioxide at the surface. On the other hand, FIG. 7A shows the resistance of the platinum film to silicidation after the rapid thermal oxidation step.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may use the RuSi$_x$ diffusion barrier layer as described herein to take advantage of the beneficial barrier characteristics thereof. Various modifications of the illustrative embodiments, as well as additional embodiments to the invention, will be apparent to persons skilled in the art upon reference to this description. It is therefore contemplated that the appended claims will cover any such modifications or embodiments that may fall within the scope of the present invention as defined by the accompanying claims.

What is claimed is:

1. A method for use in the fabrication of integrated circuits, the method comprising:
   providing a substrate assembly having a surface; and
   forming a diffusion barrier layer over at least a portion of the surface, wherein the diffusion barrier layer is formed of RuSi$_x$, where x is in the range of about 0.01 to about 10.

2. The method of claim 1, wherein x is in the range of about 1 to about 3.

3. The method of claim 2, wherein x is about 2.

4. The method of claim 1, wherein forming the barrier layer includes depositing RuSi$_x$ by chemical vapor deposition.

5. The method of claim 1, wherein forming the barrier layer includes:
   forming a layer of ruthenium relative to a silicon containing region; and
   performing an anneal to form RuSi$_x$ from the layer of ruthenium and the silicon containing region.

6. The method of claim 5, wherein forming the layer of ruthenium includes depositing the layer of ruthenium by chemical vapor deposition.

7. The method of claim 5, wherein performing the anneal to form RuSi$_x$ includes performing an anneal at a temperature in the range of about 4000° C. to about 1000° C. for about 0.5 minutes to about 60 minutes in an inert gas atmosphere.

8. The method of claim 7, wherein performing the anneal to form RuSi$_x$, includes annealing the layer of ruthenium and the silicon containing layer at a temperature of about 500° C. for about 5 minutes in a nitrogen atmosphere.

9. The method of claim 5, wherein silicon containing region includes the at least a portion of the surface.

10. The method of claim 1, wherein the method further includes forming at least one additional conductive material over the diffusion barrier layer, the at least one additional conductive material selected from a group of a metal and a conductive metal oxide.

11. A method for use in the formation of a capacitor, the method comprising:
    forming a first electrode on a portion of a substrate assembly;
    forming a high dielectric material over at least a portion of the first electrode; and
    forming a second electrode over the high dielectric material, wherein at least one of the first and second electrodes comprises a barrier layer formed of RuSi$_x$, where x is in the range of about 0.01 to about 10.

12. The method of claim 11, wherein x is in the range of about 1 to about 3.

13. The method of claim 12, wherein x is about 2.0.

14. The method of claim 11, wherein the barrier layer is formed by chemical vapor deposition.

15. A method for use in the formation of a capacitor, the method comprising:
    providing a silicon containing region of a substrate assembly;
    forming a first electrode on at least a portion of the silicon containing region of the substrate assembly, the first electrode comprising a barrier layer of RuSi$_x$, where x is in the range of about 0.01 to about 10;
    providing a high dielectric material over at least a portion of the first electrode; and
    providing a second electrode over the high dielectric material.

16. The method of claim 15, wherein x is in the range of about 1 to about 3.

17. The method of claim 15, wherein forming the barrier layer includes:
    forming a layer of ruthenium on the at least a portion of the silicon containing region; and
    annealing the layer of ruthenium formed on the at least a portion of the silicon containing region resulting in the RuSi$_x$ barrier layer.

18. The method of claim 17, wherein forming the layer of ruthenium includes depositing the layer of ruthenium by chemical vapor deposition, the layer of ruthenium having a thickness of about 10 Å to about 300 Å.

19. The method of claim 18, wherein the layer of ruthenium has a thickness of about 50 Å to about 200 Å.

20. The method of claim 19, wherein the layer of ruthenium has a thickness of about 100 Å.

21. The method of claim 18, wherein annealing the layer of ruthenium formed on the at least a portion of the silicon containing region includes annealing at a temperature in the range of about 4000° C. to about 1000° C. for about 0.5 minutes to about 60 minutes in an inert gas atmosphere.

22. The method of claim 15, wherein the $RuSi_x$ the barrier layer is formed by chemical vapor deposition using a ruthenium precursor and a silicon precursor.

23. A method for use in the formation of a capacitor, the method comprising:

provising a silicon containing region of a substrate assembly;

forming a first electrode on at least a portion of the silicon containing region of the substrate assembly, the forming of the first electrode comprising:

forming a barrier layer of $RuSi_x$, where x is in the range of about 0.01 to about 10, and forming one or more conductive layers relative to the $RuSi_x$ barrier layer, the one or more conductive layers formed of at least one of a metal or a conductive metal oxide;

providing a high dielectric material over at least a portion of the first electrode; and providing a second electrode over the high dielectric material.

24. The method of claim 23, wherein the one or more conductive layers are formed from materials selected from the group of $RuO_2$, $RhO_2$, $MoO_2$, $IrO_2$, Ru, Rh, Pd, Pt, and Ir.

25. The method of claim 23, wherein forming the barrier layer includes:

forming a layer of ruthenium on the at least a portion of the silicon containing region; and annealing the layer of ruthenium formed on the at least a portion of the silicon containing region resulting in the $RuSi_x$ barrier layer.

26. The method of claim 23, wherein the $RuSi_x$ barrier layer is formed by chemical vapor deposition using a ruthenium precursor and a silicon precursor.

* * * * *

UNITED STATES PATENT AND TRADEMARK OFFICE
CERTIFICATE OF CORRECTION

PATENT NO. : 6,197,628 B1
DATED : March 6, 2001
INVENTOR(S) : Vaartstra et al.

It is certified that error appears in the above-identified patent and that said Letters Patent is hereby corrected as shown below:

Column 6,
Line 21, before "filed Aug. 27, 1998" delete "Ser. No. 09/421,236" and insert
-- Serial No. 09/141,236 -- therefor.

Column 7,
Line 21, after "with regard to the deposition of" delete "$RuSi_xI$" and insert -- $RuSi_x$ -- therefor.

Column 9,
Lines 16-17, after "e.g., a silicon" delete "20".

Column 12, claim 7,
Line 8, after "in the range of about" delete "4000" and insert -- 400 -- therefor.

Column 13, claim 21,
Line 2, after "in the range of about" delete "4000" and insert -- 400 -- therefor.

Column 13, claim 22,
Line 4, after "$RuSi_x$" delete "the".

Column 14, claim 24,
Line 7, after "$RuO_2$" delete "$RhO_2I$" and insert -- $RhO_2$, -- therefor.

Column 14, claim 25,
Line 15, delete "$RuSi_x$," and insert -- $RuSi_x$ -- therefor.

UNITED STATES PATENT AND TRADEMARK OFFICE
CERTIFICATE OF CORRECTION

PATENT NO. : 6,197,628 B1
DATED : March 6, 2001
INVENTOR(S) : Vaartstra et al.

It is certified that error appears in the above-identified patent and that said Letters Patent is hereby corrected as shown below:

Column 14, claim 26,
Line 16, delete "$RuSi_x$," and insert -- $RuSi_x$ -- therefor.

Signed and Sealed this

Twenty-second Day of January, 2002

Attest:

Attesting Officer

JAMES E. ROGAN
Director of the United States Patent and Trademark Office